United States Patent
Runaldue

Patent Number: 5,216,636
Date of Patent: Jun. 1, 1993

[54] CMOS MEMORY CELL

[75] Inventor: Thomas J. Runaldue, San Jose, Calif.

[73] Assignee: Advanced Micro Devices, Inc., Sunnyvale, Calif.

[21] Appl. No.: 760,655

[22] Filed: Sep. 16, 1991

[51] Int. Cl.⁵ ............................................. G11C 13/00
[52] U.S. Cl. ......................... 365/230.05; 365/189.04
[58] Field of Search ...................... 365/230.05, 189.04

[56] References Cited

U.S. PATENT DOCUMENTS

| | | | |
|---|---|---|---|
| 4,768,172 | 8/1988 | Sasaki | 365/230.05 |
| 4,858,190 | 8/1989 | Yamaguchi et al. | 365/230.05 X |
| 4,933,899 | 6/1990 | Gibbs | 365/230.05 X |
| 5,023,844 | 6/1991 | Arnold et al. | 365/230.05 |

Primary Examiner—Eugene R. LaRoche
Assistant Examiner—Do Hyum You
Attorney, Agent, or Firm—Davis Chin

[57] ABSTRACT

A dual port random access memory cell is coupled to complementary read/write data bit lines, a read-only data bit line, a read/write address line and a read-only address line. The memory cell includes two two-transistor inverters (36, 38) cross-coupled to form a flip-flop core memory which is coupled to complementary input/output nodes (40, 42). A fifth transistor (44 or 56) has its main electrodes connected between the first input/output node (40) and the first read/write data bit line (BLA) and its gate electrode connected to the read/write address line (ROW SELA or ROW SELA). The sixth transistor (46 or 58) has its main electrodes connected between the second input/output node (42) and the second read/write data bit line (BLA) and its gate electrode connected to the read/write address line (ROW SELA or ROW SELA). A seventh transistor (48) has its main electrodes connected between an upper power supply potential (VCC) and a common node (54) and has its gate electrode connected to the second input/output node (42). An eighth transistor (50) has its main electrodes connected between the common node (54) and a lower power supply potential (VSS) and its gate electrode connected to the first input/output node (40). A ninth transistor (52) has its main electrodes connected between the common node (54) and the read-only date bit line (BLB) and its gate electrode connected to the read-only address line (ROW SELB).

12 Claims, 2 Drawing Sheets

CMOS MEMORY CELL

BACKGROUND OF THE INVENTION

This invention relates generally to dual port random access memory cells implemented in CMOS technology and more particularly, it relates to a CMOS dual port memory cell which provides for read-only isolation but yet has a higher layout packing density than has been traditionally available.

As is generally known in the art, dual port random access to a memory cell means that the random access memory cell has two independent data and address lines which are arrayed and interconnected for accessing the memory cell. This duality allows operations to be accomplished simultaneously or in any desired timing relationship and independently of each other (i.e., asynchronously at different data rates). One use of such dual port random access memory (RAM) cells is that it permits data to be passed between asynchronous microprocessors without establishing a handshake model which slows down the faster processor. With such dual port RAM cells, the faster processor can store, via a first "A" port, data into the dual port RAM cells, where such data can later be accessed through a second "B" port by the slower processor operated at a slower rate.

A prior art example of a CMOS dual port random access memory cell 10 is illustrated in FIG. 1. The memory cell 10 is formed of two CMOS cross-coupled inverters 12 and 14 (each consisting of a P-channel transistor and an N-channel transistor) defining a flip-flop core memory and is coupled to two independent sets of different data bit lines. The first set of bit lines BLA and $\overline{BLA}$ defining a first "A" port are coupled to the core memory via two N-channel pass transistors 16 and 18. The second set of bit lines BLB and $\overline{BLB}$ defining a second "B" port are also coupled to the core memory via two N-channel pass transistors 20 and 22. The entire memory cell 10 thus consists of eight transistors and is sometimes referred to as an 8-transistor dual port RAM cell. In order to provide a read/write access capability on port A, a word line ROW SELA assumes a high or logic "1" level. In order to provide a read/write access capability on port B, a word line ROW SELB assumes a high or logic "1" level.

The main problem encountered by this prior art memory cell 10 of FIG. 1 is the "read-disturb" phenomenon wherein when there is a read operation performed the core memory can be disturbed and thus results in a memory loss. In this memory cell 10, this problem is increased due to the fact of the two possible read ports. In order to design around this problem, the four N-channel pass transistors 16-22 are required to be reduced in size so as to provide a lower impedance path from the core memory cell inverters 12 and 14 to the corresponding bit line pairs. However, the sizing down of these pass transistors cause the circuit to lose performance in the read-access mode. While there have been attempts made in the prior art to regain this performance lost by employing clocking techniques, this suffers from the disadvantages of requiring additional precharge/evaluate circuitry as well as a differential sense amplifier which increases the clip area and production costs.

Further, there are many dual port memory systems designed today that do not require a true dual port functionality of read/write access capability at each port. Frequently, each port may have a dedicated function such as "read-only" or "write-only" operation. A prior art example of a CMOS dual port RAM cell 10a with port B designated as a "read-only" port is depicted in FIG. 2. As can be seen, this memory cell 10a has nine transistors which is one more than the conventional 8-transistor dual port RAM cell of FIG. 1. The memory cell 10a has advantages in that the two cross-coupled inverters 24 and 26 can be sized down since the read-access of the port B will not disturb the core memory.

In particular, the memory cell 10a is formed of two CMOS cross-coupled inverters 24 and 26 (each consisting of a P-channel transistor and an N-channel transistor) defining a flip-flop core memory and is coupled to first and second complementary write-only data bit lines BLA and $\overline{BLA}$. The first and second write-only data bit lines define a first "C" port and is coupled to the core memory via two N-channel pass transistors 28 and 30. A read-only data bit line $\overline{BLB}$ defining a second "D" port is coupled to the core memory via an isolation inverter 32 and a third pass transistor 34. This memory cell 10a consists of nine transistors, which is one more than the conventional 8-transistor dual port RAM cell. In order to provide the "write-only" access capability on the port C, a word line ROW SELA defining a write-only address line assumes a high or logic "1" level. In order to provide the "read-only" access capability on the port D, a word line ROW SELB defining a read-only address line assumes a high or logic "1" level.

The disadvantage suffered by the memory cell 10a of FIG. 2 is that the physical layout is not as optimized as the circuit of FIG. 1. By comparing the two different memory cells of FIGS. 1 and 2, it will be noted that there are three interconnect well crossings in FIG. 2 as opposed to the two well crossings in FIG. 1. A well crossing is required every time an interconnect is used to connect an N-channel device to a P-channel device. As is generally known to those skilled in the art, the number of well crossings used is an important factor in determining the overall core cell area.

As the storage capacity of semiconductor memory devices become greater and greater in recent developments, one of the techniques of increasing the integration density of the integrated circuit chip without increasing chip area is through the reduction of the number of well crossings during the physical layout of the memory cell. Accordingly, it would therefore be desirable to provide a CMOS dual port memory cell which has an improved layout packing density. The CMOS dual port memory cell of the present invention represents a second improvement over the prior art memory cells of FIGS. 1 and 2.

SUMMARY OF THE INVENTION

Accordingly, it is a general object of the present invention to provide an improved CMOS dual port memory cell with a read-only port which is relatively simple and economical to manufacture and assembly, but yet overcomes t he disadvantages of the prior art dual port memory cells.

It is an object of the present invention to provide a CMOS dual port memory cell which provides for read-port isolation but yet has a higher layout packing density than has been traditionally been available.

It is an object of the present invention to provide a CMOS dual port memory cell which includes two two-transistor inverters, first through third pass transistors, and first and second isolation transistors.

In accordance with these aims and objectives, the present invention is concerned with the provision of a dual port random access memory cell which is coupled to first and second complementary read/write data bit lines, a read-only data bit line, a read/write address line and a read-only address line. The memory cell includes two two-transistor inverters cross-coupled to form a four-transistor flip-flop core memory. The core memory is coupled to first and second complementary input-/output nodes. A fifth transistor has its main electrodes connected between the first input/output node and the first read/write data bit line and has its gate electrode connected to the read/write address line. A sixth transistor has its main electrode connected between the second input/output node and the second read/write data bit line and has its gate electrode connected to the read/write address line.

A seventh transistor has its main electrodes connected between an upper power supply potential and a common node and has its gate electrode connected to the second input/output node. An eighth transistor has its main electrodes coupled between the common node and a lower power supply potential and has its gate electrode connected to the first input/output node. A ninth transistor has its main electrodes connected between the common node and the read-only data bit line and has its gate electrode connected to the read-only address line.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 3:
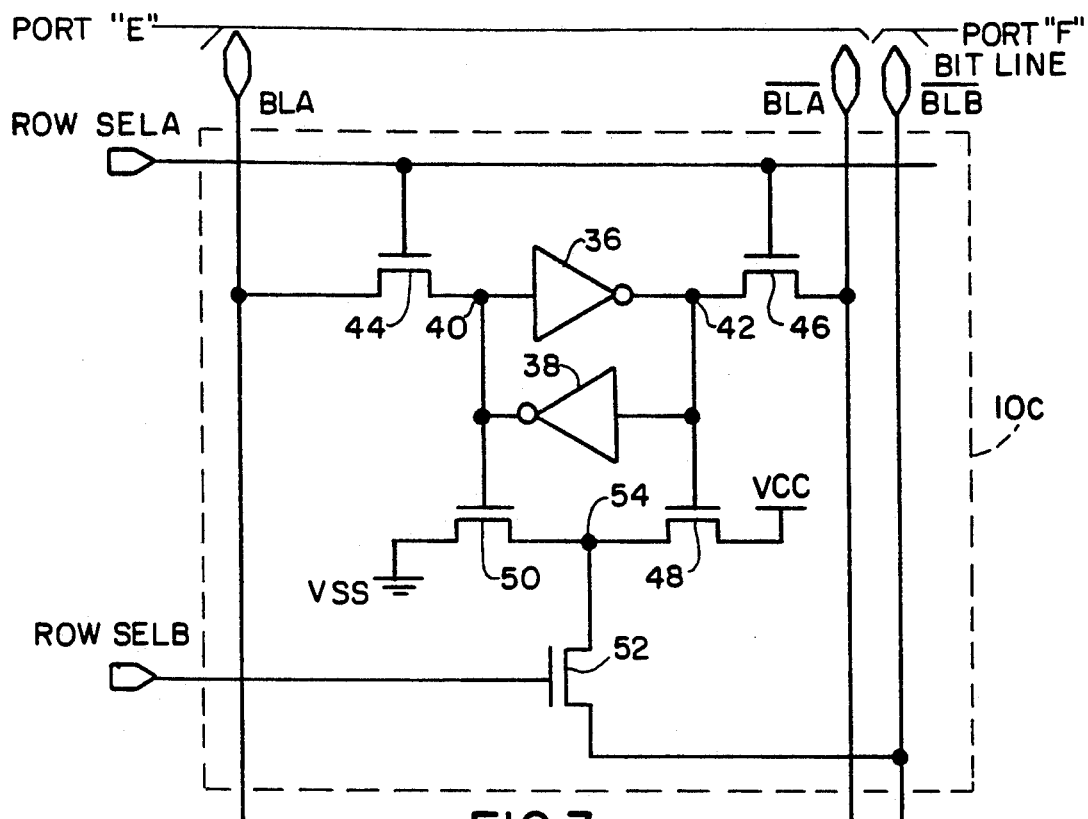
FIG. 3 shows a CMOS dual port random access memory cell, constructed in accordance with the principles of the present invention.

Referring now in detail to the drawings, there is shown in FIG. 3 a CMOS dual port random access memory cell 10c constructed in accordance with the principles of the present invention. The memory cell 10c is comprised of two two-transistor inverters 36 and 38 cross-coupled to form a four-transistor flip-flop core memory. A pair of first and second complementary read/write or write-transistor only data bit lines BLA and $\overline{BLA}$ defining a "read/write" or "write-only" port E are coupled to the core memory at respective input-/output nodes 40 and 42 via two N-channel pass transistors 44 and 46.

The memory cell 10c further includes two N-channel isolation transistors 48, 50 and an N-channel pass transistor 52. The first isolation transistor 48 has one of its main or conduction path electrodes (drain/source) connected to an upper power supply potential VCC, which is typically at +5.0 volts, and the other one of its conduction path electrodes (source/drain) connected to a common node 54. The second isolation transistor 50 has one of its main or conduction path electrodes connected to a lower power supply potential VSS, which is typically at 0 volts, and the other one of its conduction path electrodes connected to the common node 54. The gates of the isolation transistors 48 and 50 are connected to the core memory at the respective nodes 42 and 40. The pass transistor 52 has one of its main or conduction path electrodes connected to the common node 54 and its other one of the conduction path electrodes connected to read-only data bit line defining a "read-only" port F.

Figure 1:
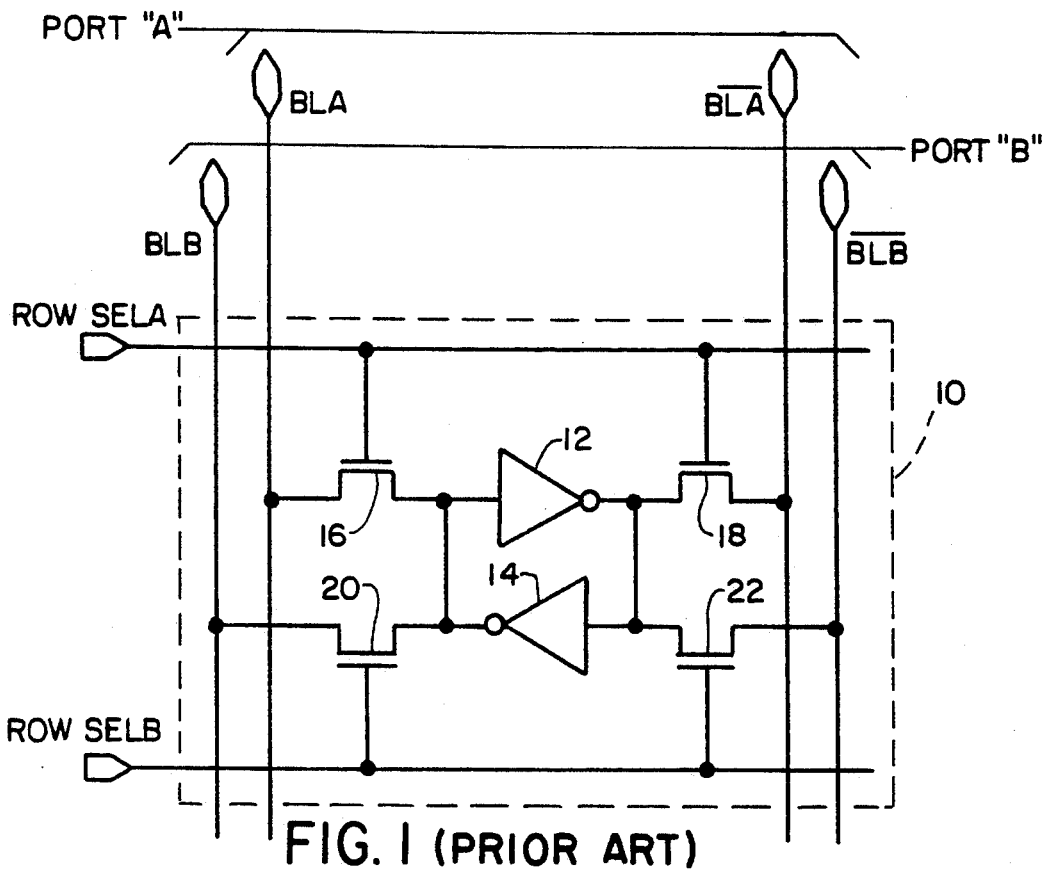
FIG. 1 shows a conventional dual port random access memory cell of the prior art.
Figure 2:
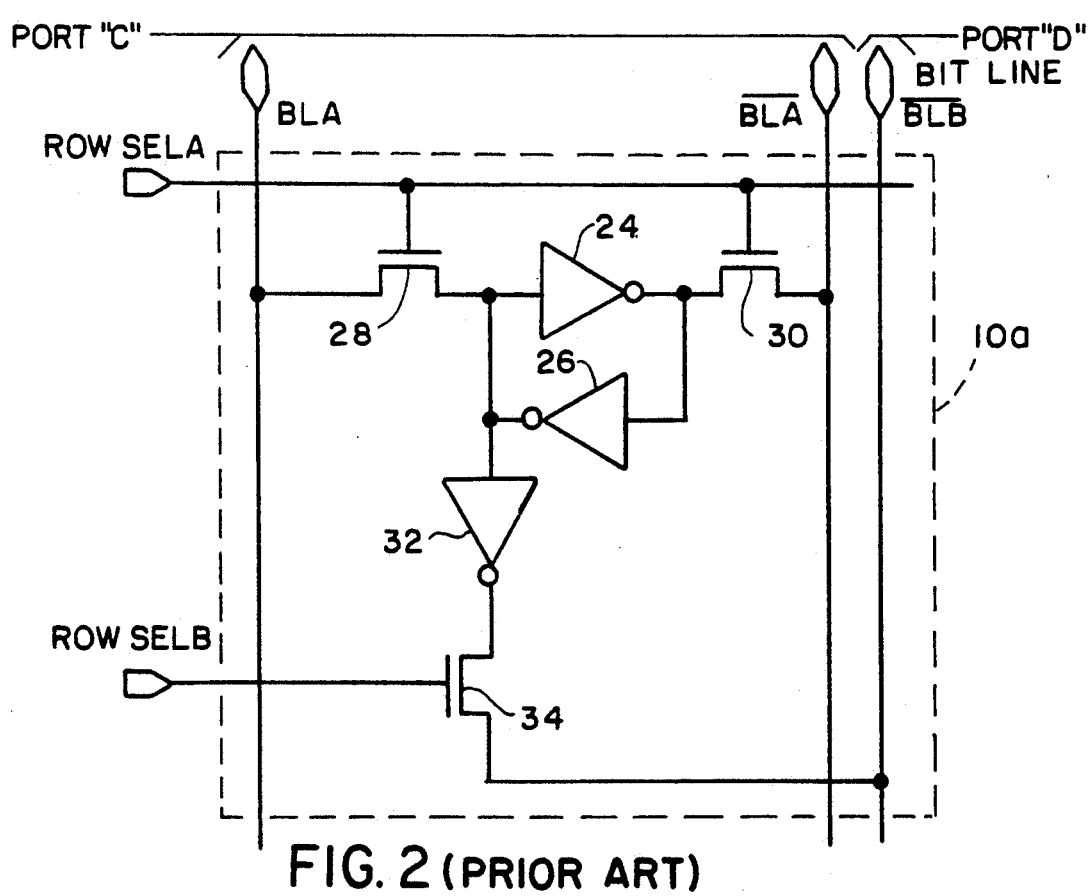
FIG. 2 shows a conventional dual port random access memory cell with a "read-only" port B of the prior art.

The memory cell 10c is independently addressed on the "read/write" or "write-only" port E by applying high or logic "1" level on a word line ROW SELA defining a read/write or write-only address line. The memory cell 10c is additional independently addressed on the "read-only" port F by applying a high or logic "1" level on a word line ROW SELB defining a read-only address line. It will be noted that the isolation inverter 32 of FIG. 2 has been replaced with two N-channel isolation transistors 48 and 50 connected to the core memory so as to obtain significant savings in the chip area but without any loss in the circuit performance. This is because the number of well crossings in FIG. 3 has been reduced to two, which is the same number as in the circuit of FIG. 1.

While the N-channel devices are generally preferred for use as the pass transistors 44 and 46 due to their higher conductance, there are certain types of applications in which the P-channel devices could be utilized instead, such as when the read-access speed is not of absolute importance or when the read-access is not required at all. In such applications, the P-channel devices will then provide for a more balanced and compact memory cell.

Figure 4:
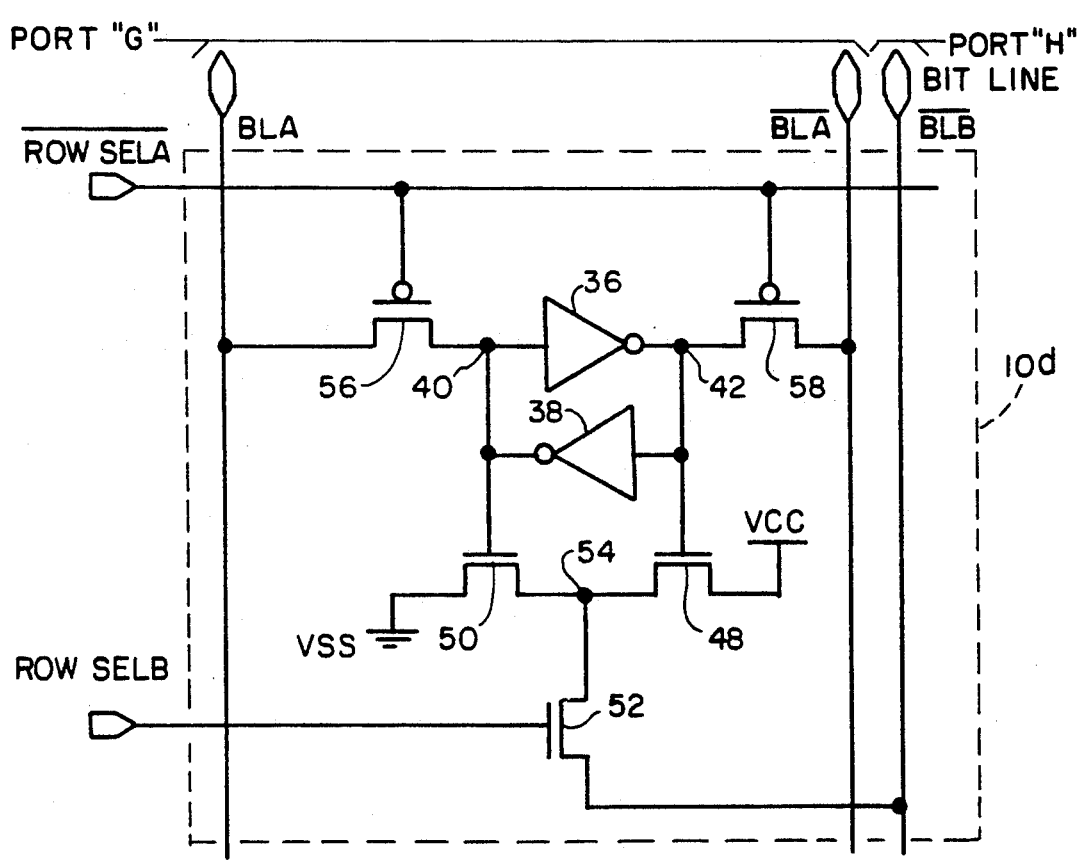
FIG. 4 shows a second embodiment of the CMOS dual port random access memory cell of the present invention.

To this end, there is shown in FIG. 4 a second embodiment of the CMOS dual port RAM cell of the present invention. In FIG. 4, the memory cell 10d thereof is quite similar to the memory cell 10c of FIG. 3. In particular, the N-channel pass transistors 44 and 46 of FIG. 3 have been replaced by P-channel pass transistors 56 and 58. It should be apparent to those skilled in the art that the first and second complementary write-only data bit lines BLA and $\overline{BLA}$ defining a "read/write" or "write-only" port G is independently addressed by applying a low level on the complement of the word line ROW SELA of FIG. 3 or $\overline{ROW\ SELA}$. Except for these differences, the memory cell 10d of FIG. 4 is identical in construction and operation to that of FIG. 3.

From the foregoing detailed description, it can thus be seen that the present invention provides an improved CMOS dual port memory cell which provides for read-port isolation but yet has a higher layout packing density than has been traditionally available. The dual port memory cell of the present invention includes two two-transistor inverters, first through third pass transistors, and first and second isolation transistors.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A dual port random access memory cell coupled to first and second complementary read/write data bit lines, a read-only data bit line, a read/write address line and a read-only address line comprising:
    two two-transistor inverters (36, 38) cross-coupled to form a four transistor flip-flop core memory, said core memory being coupled to first and second complementary input/output nodes (40, 42);
    a fifth transistor (44 or 56) having its main electrodes connected between said first input/output node (40) and said first read/write data bit line (BLA) and having its gate electrode connected to said read/write address line (ROW SELA or $\overline{\text{ROW SELA}}$);
    a sixth transistor (46 or 58) having its main electrodes connected between said second input/output node (42) and said second read/write data bit line ($\overline{\text{BLA}}$) and having its gate electrode connected to said read/write address line (ROW SELA or $\overline{\text{ROW SELA}}$);
    a seventh transistor (48) having its main electrodes connected between an upper power supply potential (VCC) and a common node (54) and having its gate electrode connected to said second input/output node (42);
    an eighth transistor (50) having its main electrodes connected between the common node (54) and a lower power supply potential (VSS) and having its gate electrode connected to said first input/output node (40); and
    a ninth transistor (52) having its main electrodes connected between the common node (54) and said read-only data bit line ($\overline{\text{BLB}}$) and having its gate electrode connected to said read-only address line (ROW SELB).

2. A dual port random access memory cell as claimed in claim 1, wherein said memory cell is implemented in complementary metal-oxide semiconductor (CMOS) technology.

3. A dual port random access memory cell as claimed in claim 2, wherein each of said two two-transistor inverters comprises a series P-conductivity type transistor and an N-conductivity type transistor.

4. A dual port random access memory cell as claimed in claim 3, wherein said fifth and sixth transistors are comprised of N-conductivity type transistors (44,46).

5. A dual port random access memory cell as claimed in claim 3, wherein said fifth and sixth transistors are comprised of P-conductivity type transistors (56,58).

6. A dual port random access memory cell as claimed in claim 4, wherein said seventh and eighth transistors are comprised of N-conductivity type transistors.

7. A dual port random access memory cell as claimed in claim 5, wherein said seventh and eighth transistors are comprised of N-conductivity type transistors.

8. A dual port random access memory cell as claimed in claim 6, wherein aid ninth transistor is comprised of and N-conductivity type transistor.

9. A dual port random access memory cell as claimed in claim 7, wherein said ninth transistor is comprised of an N-conductivity type transistor.

10. A dual port random access memory cell coupled to first and second complementary read/write data bit lines, a read-only data bit line, a read/write address line and a read-only address line comprising:
    two two-transistor inverters (36, 38) cross-coupled to form a four transistor flip-flop core memory, said core memory being coupled to first and second complementary input/output nodes (40, 42);
    a first pass transistor (44 or 56) having its main electrodes connected between said first input/output node (40) and said first read/write data bit line (BLA) and having its gate electrode connected to said read/write address line (ROW SELA or $\overline{\text{ROW SELA}}$);
    a second pass transistor (46 or 58) having its main electrodes connected between said second input/output node (42) and said second read/write data bit line ($\overline{\text{BLA}}$) and having its gate electrode connected to said read/write address line (ROW SELA or $\overline{\text{ROW SELA}}$);
    a first isolation transistor (48) having its main electrodes connected between an upper power supply potential (VCC) and a common node (54) and having its gate electrode connected to said second input/output node (42);
    a second isolation transistor (50) having its main electrodes connected between the common node (54) and a lower power supply potential (VSS) and having its gate electrode connected to said first input/output node (40); and
    a third pass transistor (52) having its main electrodes connected between the common node (54) and said read-only data bit line ($\overline{\text{BLB}}$) and having its gate electrode connected to said read-only address line (ROW SELB).

11. A dual port random access memory cell as claimed in claim 10, wherein said first and second pass transistors are comprised of N-conductivity type transistors (44,46).

12. A dual port random access memory cell as claimed in claim 10, wherein said first and second pass transistors are comprised of P-conductivity type transistors (56,58).

* * * * *

UNITED STATES PATENT AND TRADEMARK OFFICE
CERTIFICATE OF CORRECTION

PATENT NO. : 5,216,636
DATED : June 1, 1993
INVENTOR(S) : Thomas J. Runaldue

It is certified that error appears in the above-identified patent and that said Letters Patent is hereby corrected as shown below:

Column 1, line 63, "clip", should be --chip--.

Column 2, line 61, "t he", should be --the--.

Column 3, line 59, "write-transistor only", should be
    --write-only--.

Column 5, line 22, "sad", should be --said--.

Column 6, line 12, "and", should be --an--.

Signed and Sealed this

Eighteenth Day of January, 1994

Attest:

BRUCE LEHMAN

Attesting Officer

Commissioner of Patents and Trademarks